(12) United States Patent
Tran et al.

(10) Patent No.: US 9,570,386 B2
(45) Date of Patent: Feb. 14, 2017

(54) FLEXIBLE PACKAGE-TO-SOCKET INTERPOSER

(71) Applicant: INTEL CORPORATON, Santa Cara, CA (US)

(72) Inventors: Donald T. Tran, Phoenix, AZ (US); Zhichao Zhang, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/727,776

(22) Filed: Jun. 1, 2015

(65) Prior Publication Data

US 2015/0262916 A1    Sep. 17, 2015

Related U.S. Application Data

(63) Continuation of application No. 13/658,380, filed on Oct. 23, 2012, now Pat. No. 9,076,698.

(51) Int. Cl.
| | |
|---|---|
| *H05K 7/00* | (2006.01) |
| *H01L 23/498* | (2006.01) |
| *H01R 12/00* | (2006.01) |
| *H05K 1/00* | (2006.01) |
| *H01L 23/13* | (2006.01) |
| *H01L 21/48* | (2006.01) |
| *H01L 23/00* | (2006.01) |

(52) U.S. Cl.
CPC ......... *H01L 23/4985* (2013.01); *H01L 21/486* (2013.01); *H01L 21/4857* (2013.01); *H01L 23/13* (2013.01); *H01L 23/49811* (2013.01); *H01L 23/49816* (2013.01); *H01L 23/49822* (2013.01); *H01L 23/49827* (2013.01); *H01L 23/49833* (2013.01); *H01L 23/49838* (2013.01); *H01L 24/17* (2013.01); *H01L 24/81* (2013.01); *H01R 12/00* (2013.01); *H05K 1/00* (2013.01); *H01L 2224/1601* (2013.01); *H01L 2224/16057* (2013.01); *H01L 2224/16225* (2013.01); *H01L 2224/81801* (2013.01); *H01L 2924/0002* (2013.01); *H01L 2924/15313* (2013.01); *Y10T 29/49204* (2015.01)

(58) Field of Classification Search
CPC ............ H05K 7/00; H05K 1/18; H05K 1/16; H05K 1/00; H01K 1/11
USPC . 361/760, 767, 749; 257/686–698; 174/262, 174/254, 255, 263, 264, 265, 266; 439/77, 439/66, 68, 69, 67, 82, 83
See application file for complete search history.

(56) References Cited

U.S. PATENT DOCUMENTS

| | | | |
|---|---|---|---|
| 6,017,222 A | 1/2000 | Kao | |
| 6,717,819 B1 * | 4/2004 | Chung | .......... B32B 37/203 361/760 |
| 6,797,891 B1 * | 9/2004 | Blair | ............. H05K 1/147 174/110 R |
| 7,172,455 B2 | 2/2007 | Pabst et al. | |

(Continued)

*Primary Examiner* — Abdullah Riyami
*Assistant Examiner* — Harshad Patel
(74) *Attorney, Agent, or Firm* — Winkle, PLLC (57) ABSTRACT

A flexible interposer for the attachment of a microelectronic package to a microelectronic socket, wherein a first portion of the flexible substrate may be positioned between the microelectronic package and the microelectronic socket, and a second portion of the flexible interposer may extend from between the microelectronic package and the microelectronic socket to electrically contact an external component. In one embodiment, the external component may be a microelectronic substrate and the microelectronic socket may be attached to the microelectronic substrate.

26 Claims, 7 Drawing Sheets

(56) References Cited

U.S. PATENT DOCUMENTS

| | | | |
|---|---|---|---|
| 7,402,254 B2* | 7/2008 | Curcio | H05K 3/462 |
| | | | 216/20 |
| 7,641,481 B2 | 1/2010 | Trobough | |
| 8,007,287 B1* | 8/2011 | Champion | H01R 12/714 |
| | | | 439/66 |
| 8,120,173 B2* | 2/2012 | Forman | H01L 21/6835 |
| | | | 361/760 |
| 8,242,384 B2* | 8/2012 | Cases | H05K 1/0251 |
| | | | 361/600 |
| 9,076,698 B2* | 7/2015 | Tran | H01L 23/49833 |
| | | | 361/767 |
| 2002/0191366 A1* | 12/2002 | Naito | H01G 4/30 |
| | | | 361/302 |
| 2003/0139071 A1 | 7/2003 | Li et al. | |
| 2004/0166702 A1* | 8/2004 | Higashi | H01R 13/2407 |
| | | | 439/66 |
| 2004/0203261 A1* | 10/2004 | DeFord | H01R 13/2435 |
| | | | 439/66 |
| 2004/0203268 A1* | 10/2004 | Nishizawa | C08L 83/04 |
| | | | 439/91 |
| 2004/0207062 A1 | 10/2004 | Tran | |
| 2005/0029667 A1 | 2/2005 | Yamashita et al. | |
| 2011/0073355 A1* | 3/2011 | Tamura | H05K 3/32 |
| | | | 174/255 |

* cited by examiner

FLEXIBLE PACKAGE-TO-SOCKET INTERPOSER

RELATED APPLICATIONS

The present application is a continuation of U.S. patent application Ser. No. 13/658,380, filed on Oct. 23, 2012, entitled "FLEXIBLE PACKAGE-TO-SOCKET INTERPOSER", which are hereby incorporated herein by reference in its entirety and for all purposes.

TECHNICAL FIELD

Embodiments of the present description generally relate to the field of microelectronic package mounting structures.

BACKGROUND ART

The microelectronic industry is continually striving to produce ever faster and smaller microelectronic structures for use in various mobile electronic products, such as portable computers, electronic tablets, cellular phones, digital cameras, and the like. Microelectronic packages, such packages including a microprocessor, a chipset, a graphics device, a wireless device, a memory device, an application specific integrated circuit, or the like, may be attached to a microelectronic substrate through a microelectronic socket mounted to the microelectronic substrate. However, for a given sized microelectronic socket, there are a limited number of interconnects can be formed through the microelectronic socket to provide conductive routes between the microelectronic package and the microelectronic substrate. This can create significant constraints with regard to mounting high input/output microelectronic packages using microelectronic sockets.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

Embodiments of the present description relate to a flexible interposer for the attachment of a microelectronic package to a microelectronic socket and, more particularly, to a microelectronic structure wherein a first portion of a flexible interposer is positioned between the microelectronic socket and the microelectronic package and a second portion of the flexible interposer attached to an external component, such that the flexible interposer electrically connects the microelectronic package to the microelectronic socket, and electrically connects the microelectronic package to an external component. In one embodiment, the external component may be a microelectronic substrate and the microelectronic socket may be attached to the microelectronic substrate.

Figure 1:
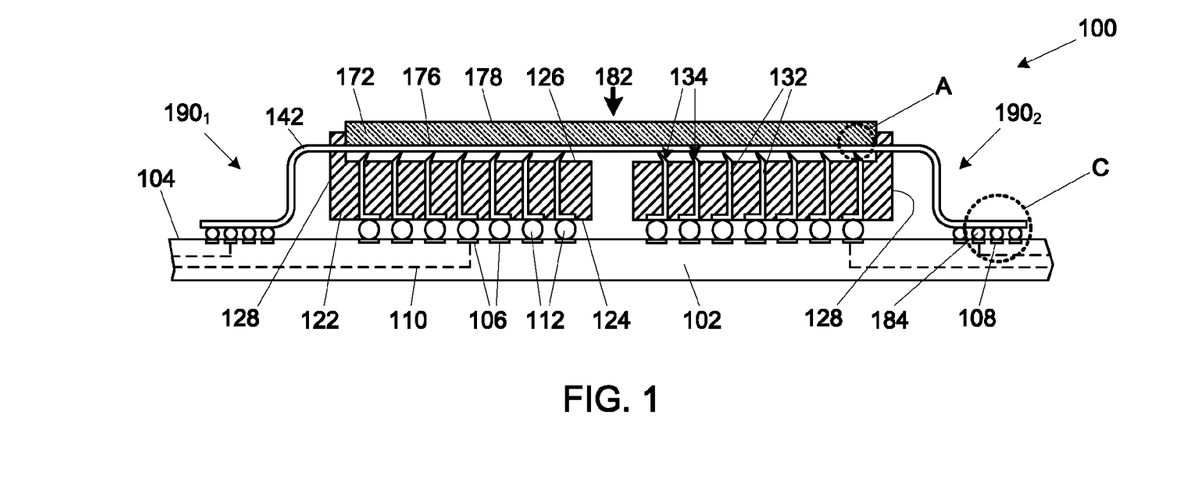
FIG. 1 illustrates a side cross-sectional view of a microelectronic structure including a flexible interposer disposed between a microelectronic package and a microelectronic substrate, according to one embodiment of the present description.

As shown in FIG. 1, a microelectronic structure 100 may be formed by providing or forming a microelectronic substrate 102, such as a printed circuit board or the like. A microelectronic socket 122, such as a land grid array socket, may be attached to a first surface 104 of the microelectronic substrate 102 with a plurality of interconnects 112. The socket-to-substrate interconnects 112, such as soldered interconnects, may extend between conductive structures 132 extending through the microelectronic socket 122 and substantially mirror-image socket bond pads 106 in or on the microelectronic substrate first surface 104. The microelectronic socket conductive structures 132 may extend through the microelectronic socket 122 from a second surface 124 of the microelectronic socket 122 proximate the microelectronic substrate 102 to a first surface 126 of the microelectronic socket 122 opposing the microelectronic socket second surface 124. The microelectronic socket conductive structures 132 may each include a projection 134 that extends from the microelectronic socket first surface 126. The microelectronic socket conductive structure projections 134 may be flexible, as will be understood to those skilled in the art.

Figure 2:
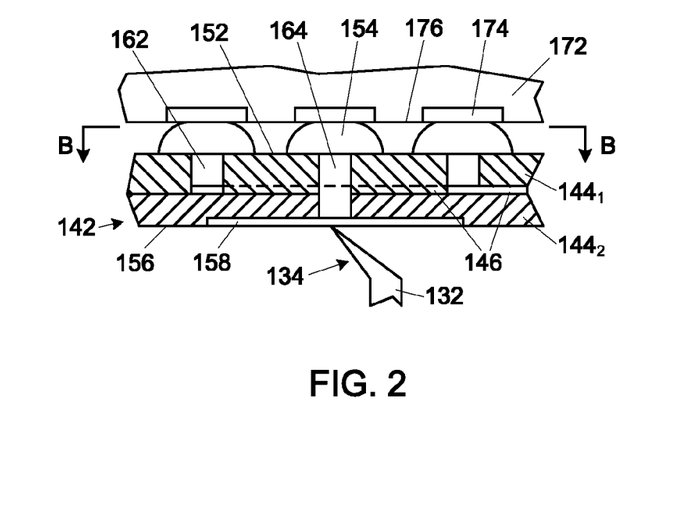
FIG. 2 illustrates a side cross-sectional close-up view of insert A of FIG. 1, according to one embodiment of the present description.

A flexible interposer 142 may be positioned proximate the microelectronic socket first surface 126. As shown in FIG. 2, the flexible interposer 142 may comprise at least one flexible dielectric layer (shown as flexible dielectric layers $144_1$ and $144_2$) and at least one flexible signal routing trace 146 (shown between flexible dielectric layers $144_1$ and $144_2$). The term flexible as used herein may include the attribute of being able to be bent or otherwise deformed without breaking or cracking. The flexible interposer 142 may include a first surface 152 having a plurality of interconnects 154 disposed thereon and a second surface 156 having a plurality of socket contacts 158. A first plurality of conductive vias 162 may extend into at least one flexible dielectric layer (shown as flexible dielectric layer $144_1$) and electrically connect a portion of the plurality of flexible interposer interconnects 154 to their respective flexible signal routing trace(s) 146. A second plurality of conductive vias 164 may extend through the flexible interposer 142 from the flexible interposer first surface 152 to the flexible interposer second surface 156 to electrically connect a portion of the plurality of flexible interposer interconnects 154 to their respective flexible interposer socket contacts 158. As further shown in FIG. 2, each of the microelectronic socket conductive structure projections 134 may contact a respective flexible interposer socket contact 158.

Figure 3:
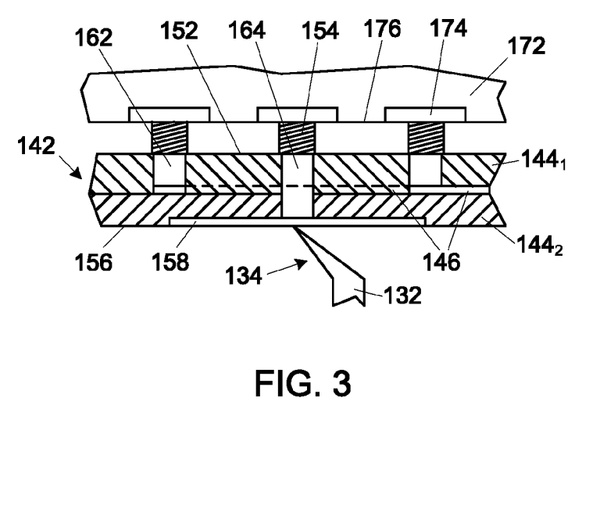
FIG. 3 illustrates a side cross-sectional view of insert A of FIG. 1 where the flexible interposer contacts the microelectronic package with a resilient contact, according to an embodiment of the present description.
Figure 4:
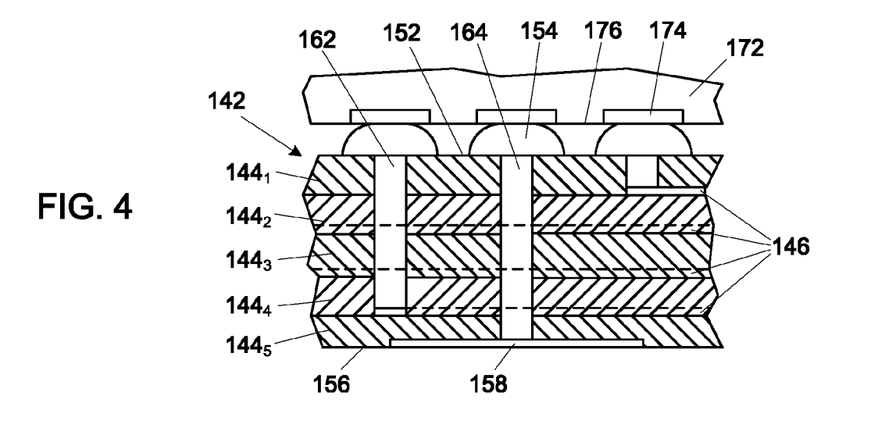
FIG. 4 illustrates a side cross-sectional view of insert A of FIG. 1 where the flexible interposer has a multilayer structure, according to an embodiment of the present description.

In one embodiment of the present description, the flexible dielectric layers (e.g. flexible dielectric layers $144_1$ and $144_2$) may be formed from a polyimide material (such as Kapton® by DuPont, Wilmington, Del., USA), a polyester material (such as polyether ether ketone ("PEEK")), a polyethylene terephthalate ("PET") material, liquid crystal polymer (LCP), and the like. In an embodiment of the present description, the flexible dielectric layers $144_1$ and $144_2$ may less than about 0.05 mm thick. In another embodiment, the flexible signal routing traces 146 may be thin conductive strips, such as copper, silver, gold, aluminum, and the like, and may be less than about 0.07 mm thick. In still another embodiment of the present description, the flexible interposer socket contacts 158, the first plurality of conductive vias 162, and the second plurality of conductive vias 164 may be made of any appropriate conductive material, including, but not limited to, copper, silver, gold, aluminum, conductive diamond dust, and the like. In yet another embodiment of the present description, the flexible interposer interconnects 154, may be made of an appropriate solder material, including, but not limited to, lead/tin alloys and high tin content alloys (e.g. about 90% or more tin), and similar alloys. In still another embodiment of the present description, the flexible interposer interconnects 154, may be made of any appropriate conductive material, including, but not limited to, copper, silver, gold, aluminum, and the like. In another embodiment, the flexible interposer interconnects 154 may be formed from a deformable material, such as a polymer or adhesive filled with a conductive material. In yet another embodiment, the flexible interposer interconnects 154 mechanically deformable structures, such as micro-springs, as shown in FIG. 3. Furthermore, the flexible interposer 142 is not limited to the two flexible dielectric material layers (i.e. elements $144_1$ and $144_2$) and a single layer of flexible signal routing traces 146, as shown in FIG. 2. For example, as shown in FIG. 4, multiple layers of flexible signal routing traces (i.e. elements $146_1$, $146_2$, $146_3$, and $146_4$) may be disposed between multiple flexible dielectric material layers (i.e. elements $144_1$, $144_2$, $144_3$, $144_4$, $144_5$, and $144_6$). The methods of fabricating such flexible devices are known in the art, and, for the sake of brevity, will not be discussed herein.

Figure 5:
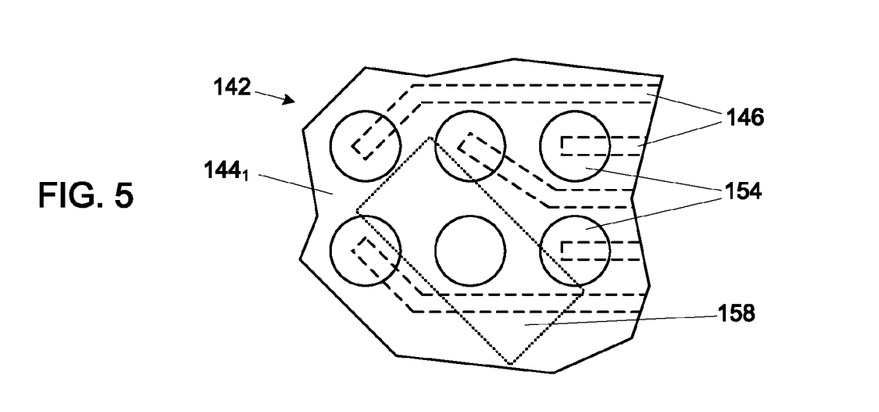
FIG. 5 illustrates a top plan view along line B-B of FIG. 2, according to one embodiment of the present description.

FIG. 5 is a top plan view along line B-B of FIG. 2, which illustrates an exemplary arrangement of the flexible interposer interconnects 154, the flexible signal routing traces 146 (shown in dashed shadow lines), and the flexible interposer socket contacts 158 (shown in dotted shadow lines). It is understood that the flexible interposer interconnects 154, the flexible signal routing traces 146, and the flexible interposer socket contacts 158 may have any appropriate shape, placement, and/or configuration.

Referring to FIGS. 1-4, a microelectronic package 172 may be in electrical contact with the flexible interposer 142 through a plurality of bond pads 174 disposed on or in a first surface 176 of the microelectronic package 172. The microelectronic package bond pads 174 may have a substantially mirror-image configuration to the flexible interposer interconnects 154. As will be understood to those skilled in the art, the microelectronic package bond pads 174 are in electrical communication with integrated circuitry (not shown) of microelectronic devices (not shown) within the microelectronic package 172. The microelectronic package 172 may include at least one microelectronic device, such as a microprocessor, a chipset, a graphics device, a wireless device, a memory device, an application specific integrated circuit device, and the like. As will be understood to those skilled in the art, when a solder material is used to form the flexible interposer interconnects 154, they may be reflowed to adhere to their respective microelectronic package bond pads 174.

Referring to FIG. 1, a biasing force (shown as arrow 182) may be imparted on a second surface 178 of the microelectronic package 172 opposing the microelectronic package first surface 176. In one embodiment of the present description, the biasing force 182 may be directed on the microelectronic package 172 toward the microelectronic substrate 102, such that contact is maintained between the microelectronic socket conductive structures 132 and the flexible interposer socket contacts 158. In another embodiment of the present description, the biasing force 182 may be directed on the microelectronic package 172 toward the microelectronic substrate 102, such that contact is maintained between the microelectronic socket conductive structures 132 and the flexible interposer socket contacts 158, and between the flexible interposer interconnects 154 and the microelectronic package bond pads 174. Furthermore, the biasing force 182 may be directed substantially perpendicularly to the microelectronic substrate 102. It is understood that the biasing force 182 may be imparted by a variety of biasing mechanisms (not shown), which are known in the art.

Figure 6:
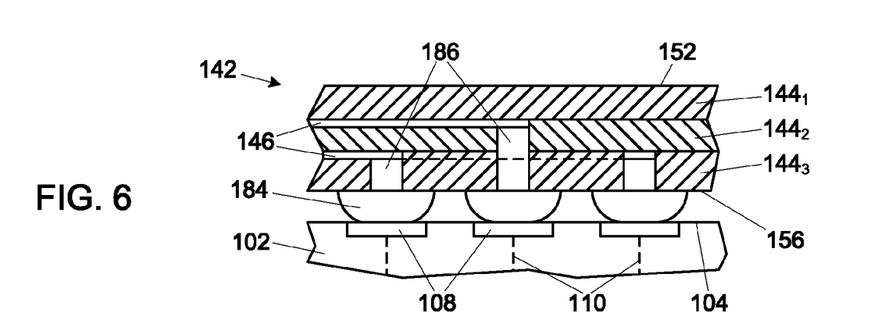
FIG. 6 illustrates a side cross-sectional view of insert C of FIG. 1 of the attachment of the flexible interposer to the microelectronic substrate, according to an embodiment of the present description.

Referring again to FIG. 1, the microelectronic socket 122 includes at least one side 128 extending from the microelectronic socket first surface 126 to the microelectronic socket second surface 124. At least one portion of the flexible interposer 142 (shown as a flexible interposer first portion 190$_1$ and a flexible interposer second portion 190$_2$) may extend from at least one microelectronic socket side 128 to connect with an external component (shown as the microelectronic substrate 102). As shown in FIGS. 1 and 6, the flexible interposer 142 may be connected to the microelectronic substrate 102 with a plurality of substrate interconnects 184 on the flexible interposer 142, wherein the flexible interposer substrate interconnects 184 may be electrically connected to a plurality of interposer bond pads 108 disposed on or in the microelectronic package first surface 104. The each of the flexible interposer substrate interconnects 184 may be connected to a respective flexible signal routing trace 146 through at least one of a third plurality of conductive vias 186. The plurality of microelectronic substrate interposer bond pads 108 may have a substantially mirror-image configuration to the flexible interposer substrate interconnects 184. In one embodiment of the present description, the flexible interposer substrate interconnects 184, may be made of an appropriate solder material, including, but not limited to, lead/tin alloys and high tin content alloys (e.g. about 90% or more tin), and similar alloys, which may be reflowed to connect the flexible interposer substrate interconnects 184 to the microelectronic substrate interposer bond pads 108. In another embodiment, the flexible interposer substrate interconnects 184 may be formed from a conductive material filled adhesive material.

As further shown in FIG. 1, the microelectronic substrate 102 may provide electrical communication routes (illustrated as dashed lines 110, on or within the microelectronic substrate 102) between the microelectronic package 172 and external devices (not shown) either through the microelectronic socket 122 or through the flexible interposer 142.

Figure 7:
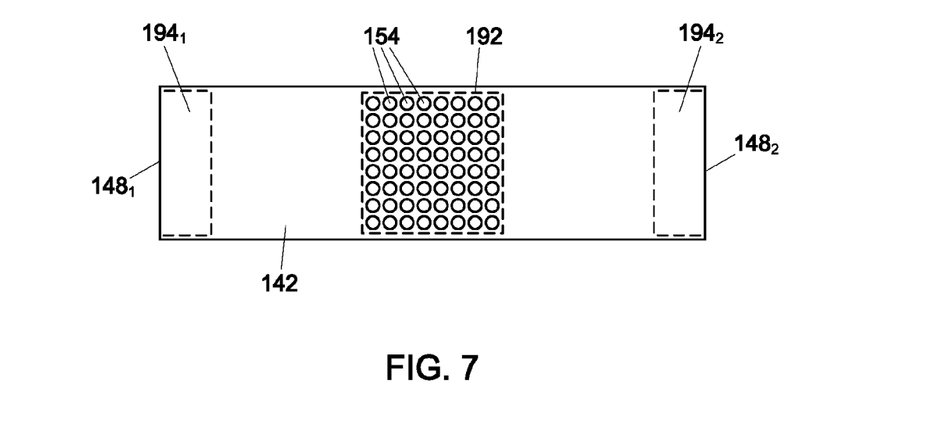
FIG. 7 illustrates a top plan view of a flexible interposer having two external connection zones, according to an embodiment of the present description.

As previously discussed, the flexible interposer 142 of FIG. 1 may have the first portion 190$_1$ and the second portion 190$_2$ which extend from the microelectronic socket 122. As shown in FIG. 7, the flexible interposer first portion 190$_1$ and the flexible interposer second portion 190$_2$ may extend from a portion of the flexible interposer 142 that may be defined as a package/socket contact area 192, which contains the flexible interposer interconnects 154 and the flexible interposer socket contacts 158 (not shown). At an end 148$_1$ of the flexible interposer first portion 190$_1$, an attachment area 194$_1$ may be defined, which contains the flexible interposer substrate interconnects 184 (not shown) or other attachment mechanisms. Likewise, at an end 148$_2$ of the flexible interposer second portion 190$_2$, which may oppose the flexible interposer first portion end 148$_1$, an attachment area 194$_2$ may be defined, which may contain the flexible interposer substrate interconnects 184 (not shown) or other attachment mechanisms.

Figure 8:
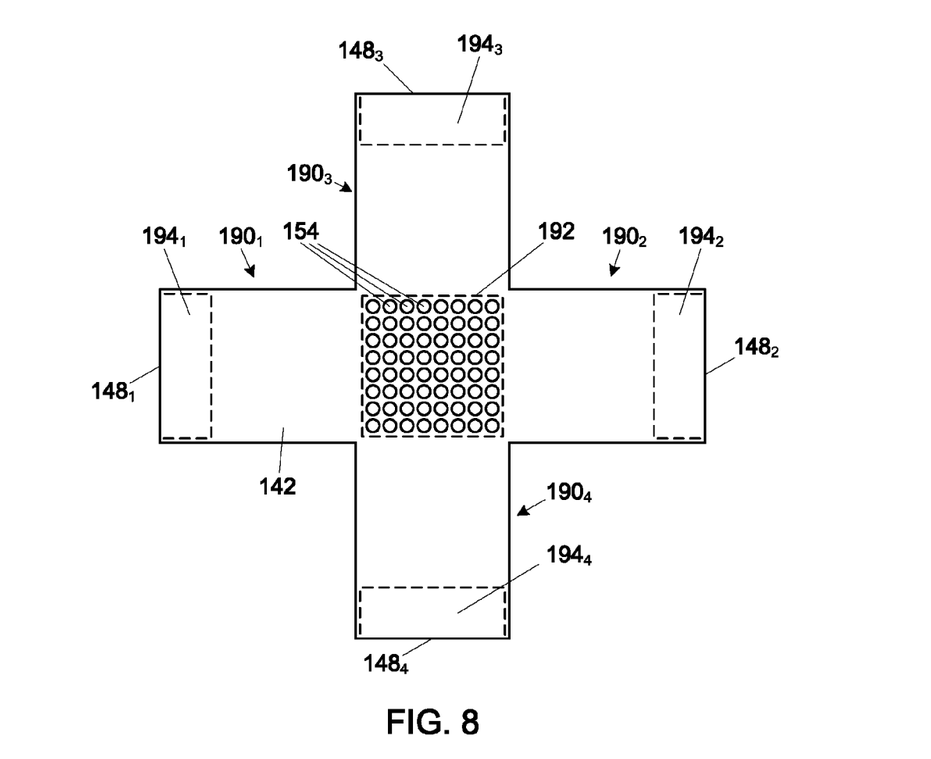
FIG. 8 illustrates a top plan view of a flexible interposer having four external connection zones, according to another embodiment of the present description.

It is understood that the flexible interposer 142 may not be limited to the configuration shown in FIG. 7. In another embodiment show in FIG. 8, the flexible interposer 142 may include the flexible interposer first portion 190$_1$ and the flexible interposer second portion 190$_2$, as well as a flexible interposer third portion 190$_3$ and a flexible interposer fourth portion 190$_4$. The orientation of the flexible interposer first portion 190$_1$ relative to the flexible interposer second portion 190$_2$ may be substantially perpendicularly to the orientation of the flexible interposer third portion 190$_3$ relative to the flexible interposer fourth portion 190$_4$. At an end 148$_3$ of the flexible interposer third portion 190$_3$, an attachment area 194$_3$ may be defined, which contains the flexible interposer substrate interconnects 184 (not shown) or other attachment mechanisms. Likewise, at an end 148$_4$ of the flexible interposer fourth portion 190$_4$, which may oppose the flexible interposer third portion end 148$_3$, an attachment area 194$_4$ may be defined, which may contain the flexible interposer substrate interconnects 184 (not shown) or other attachment mechanisms.

Figure 9:
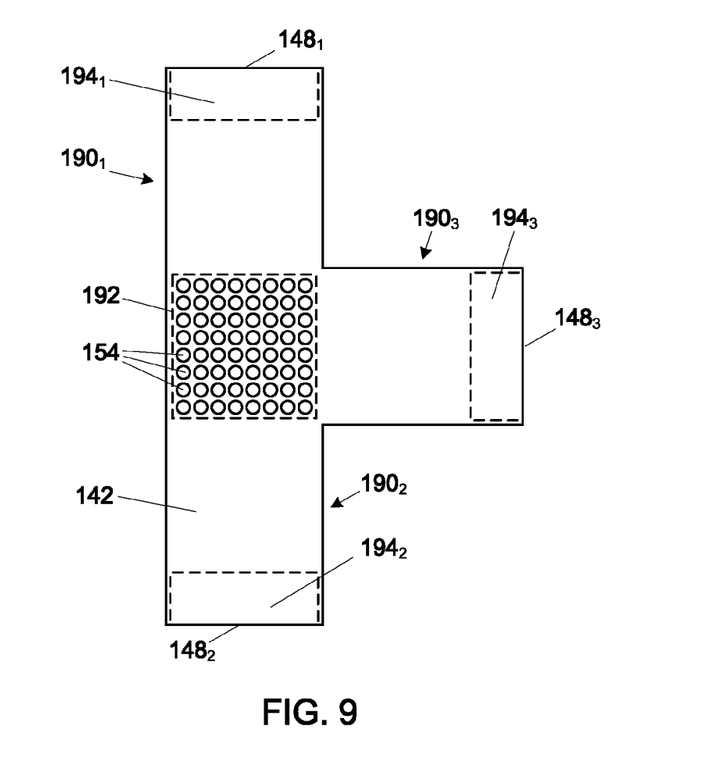
FIG. 9 illustrates a top plan view of a flexible interposer having three external connection zones, according to yet another embodiment of the present description.
Figure 10:
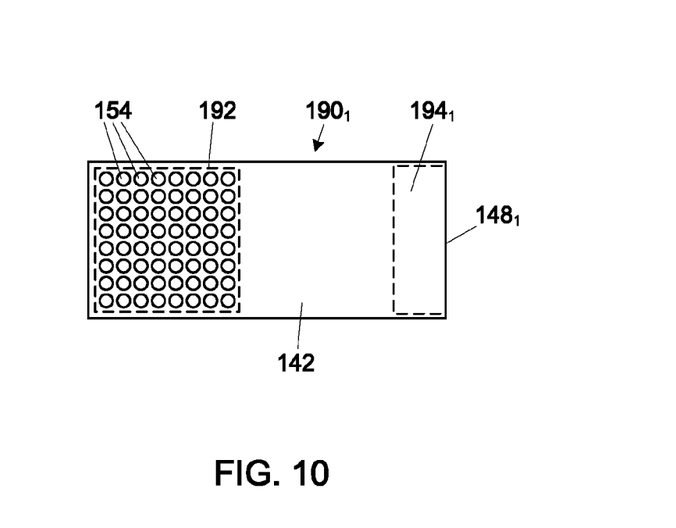
FIG. 10 illustrates a top plan view of a flexible interposer having a single external connection zone, according to still another embodiment of the present description.

In still another embodiment shown in FIG. 9, the flexible interposer 142 may include only the flexible interposer first portion 190$_1$, the flexible interposer second portion 190$_2$, and the flexible interposer third portion 190$_3$. Furthermore, it is understood that the flexible interposer 142 may have only a single flexible interposer portion, e.g. flexible interposer first portion 190$_1$, as shown in FIG. 10. It is understood that the embodiments shown in FIGS. 7-10 are merely exemplary any appropriate configuration for the flexible interposer 142 may be utilized.

Figure 11:
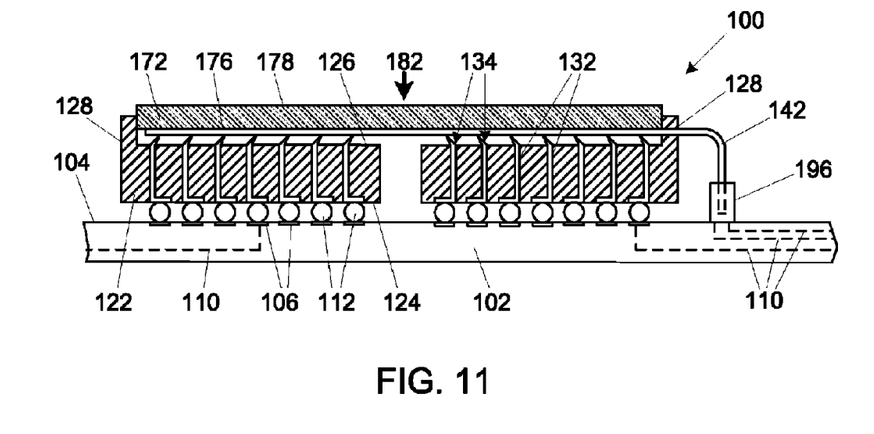
FIG. 11 illustrates a side cross-sectional view of a microelectronic structure including a flexible interposer disposed between a microelectronic package and a microelectronic substrate wherein the flexible interposer is connected to the microelectronic with a connector, according to one embodiment of the present description.

FIG. 11 illustrates an embodiment of the present description utilizing the flexible interposer 142 of FIG. 10. As shown in FIG. 11, the connection of the flexible interposer 142 to the microelectronic substrate 102 may be achieved with a connection structure 196 electrically coupled to the microelectronic substrate 102, wherein the flexible interposer 142 may be inserted into the connection structure 196 to achieved electrical contact therewith.

Figure 12:
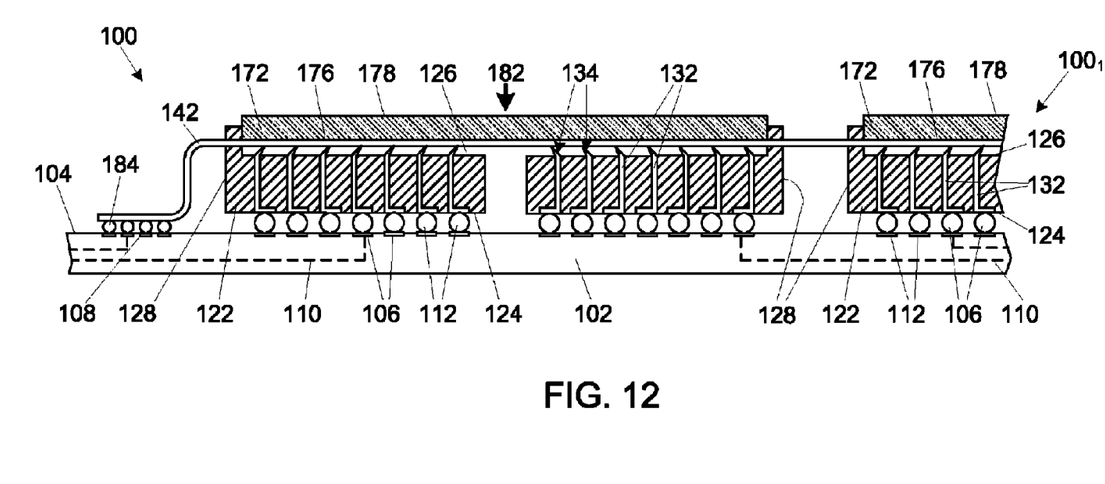
FIG. 12 illustrates a side cross-sectional view of a microelectronic structure including a flexible interposer disposed between a microelectronic package and a microelectronic substrate wherein the flexible interposer is connected to an external device, according to one embodiment of the present description.
Figure 13:
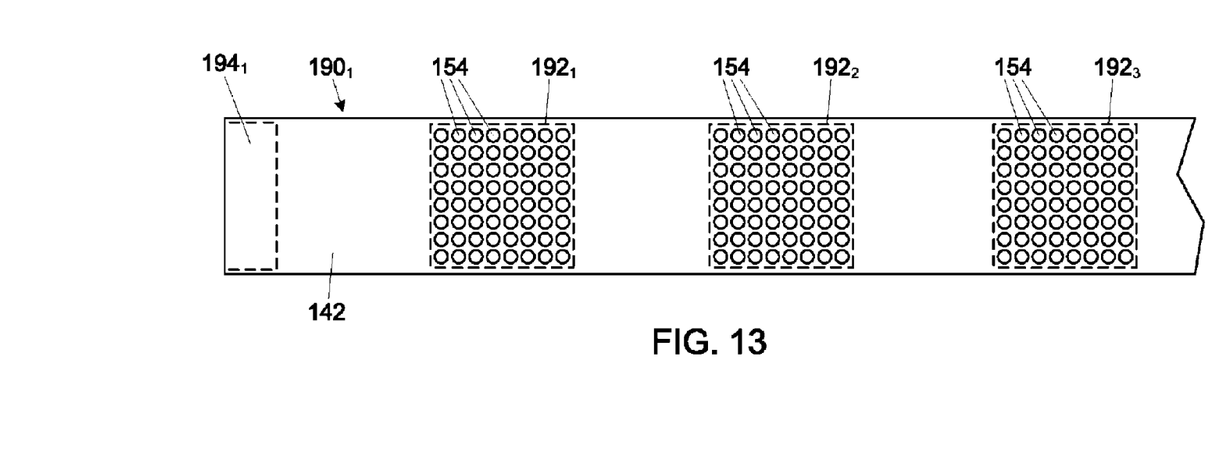
FIG. 13 illustrates a top plan view of the interposer of FIG. 12, according to one embodiment of the present description.
Figure 14:
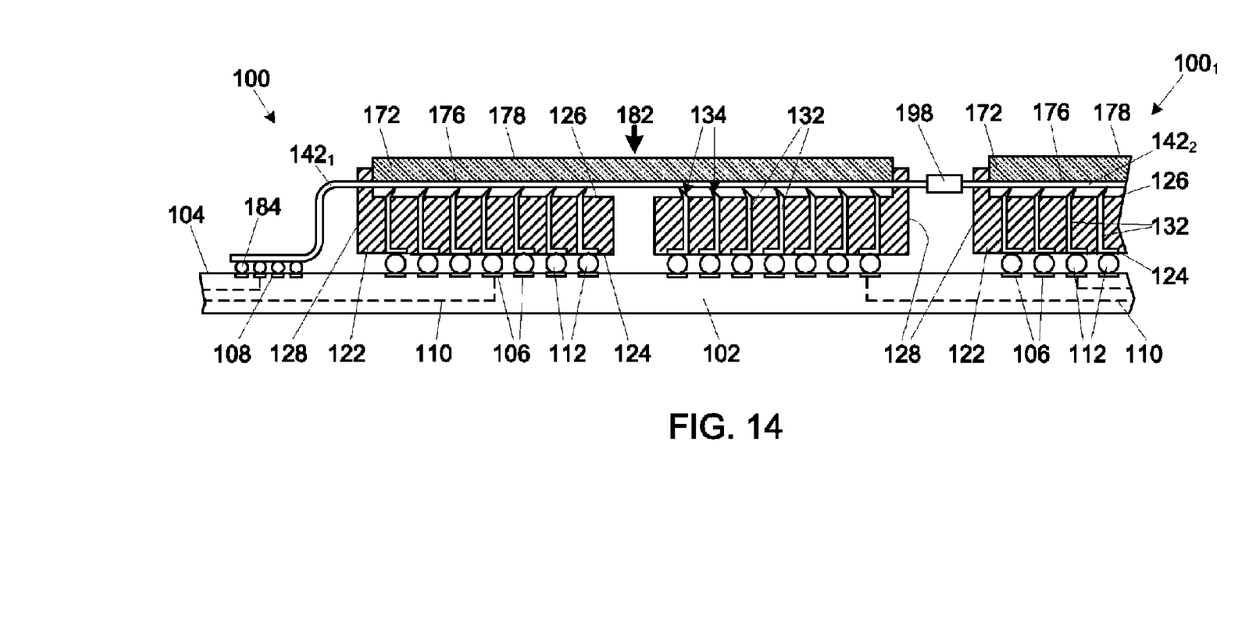
FIG. 14 illustrates a side cross-sectional view of a microelectronic structure including a flexible interposer disposed between a microelectronic package and a microelectronic substrate wherein the flexible interposer is connected to an external device, according to another embodiment of the present description.

FIG. 12 illustrates an embodiment of the present description utilizing the flexible interposer 142 to span from the microelectronic structure 100, such as shown FIG. 1, to a second microelectronic structure 100$_1$ having component of that of the microelectronic structure 100. The flexible interposer 142 of FIG. 12 could have a plurality of package/socket contact areas, which are illustrated as elements 192$_1$, 192$_2$, and 192$_3$, in FIG. 13. Of course, the second structure 100$_1$ could be any appropriate microelectronic device including a peripheral component, an electrical-to-optical conversion device, or the like. Furthermore, the flexible interposer 142 shown in FIG. 13 may be separate flexible interposers, such as flexible interposers 142$_1$ and 142$_2$ attached by a connector 198 to make an electric connection therebetween, as shown in FIG. 14.

The embodiments of the present application may allow for the use of a microelectronic socket having conventional size while allowing for the attachment of a high density microelectronic package. The microelectronic package bond pads 174 may have a finer pitch (e.g. center-to-center distance) than the pitch of the microelectronic socket conductive structures 132. Thus, a portion of the microelectronic bond package pads 174 are connected through the microelectronic socket 122, and a remainder of the microelectronic package bond pads 174 are connected through the flexible signal routing traces 146 of the flexible interposer 142.

As will be understood to those skilled in the art, the subject matter of the present description can simplify the loading mechanism and customer assembly process. The flexible interposer 142 loading can be combined with a socket loading mechanism without a separate loading fixture (not illustrated). The components can be shipped separately and assembled on site to lower the assembly difficulty and risks. The subject matter of the present description may also reduce socket bent pin damage encountered during system assembly. Furthermore, the different flexible interposers 142 could be fabricated to allow for the use of different components or features within the microelectronic package 172. Thus, the flexible interposers 142 could be used as "pay-as-you-go" bandwidth expansion solutions.

As will be further understood to those skilled in the art, the bandwidth expansion factor and number of signal routing layers may be determined based on the bump pitch, as shown in Table 1. As shown in Table 1, a 50% to 100% bandwidth can be achieved with 0.7-0.8 mm pitch on a 2-6 routing layer flexible interposer.

TABLE 1

| Flex Conneciton Pitch (mm) | Bandwidth Expansion Factor (%) | Number of Escapable Traces |
|---|---|---|
| 0.5 | 300 | 1 |
| 0.6 | 170 | 3 |
| 0.7 | 100 | 5 |
| 0.8 | 56 | 6 |
| 0.9 | 23 | 8 |
| 1 | 0 | 10 |

Figure 15:
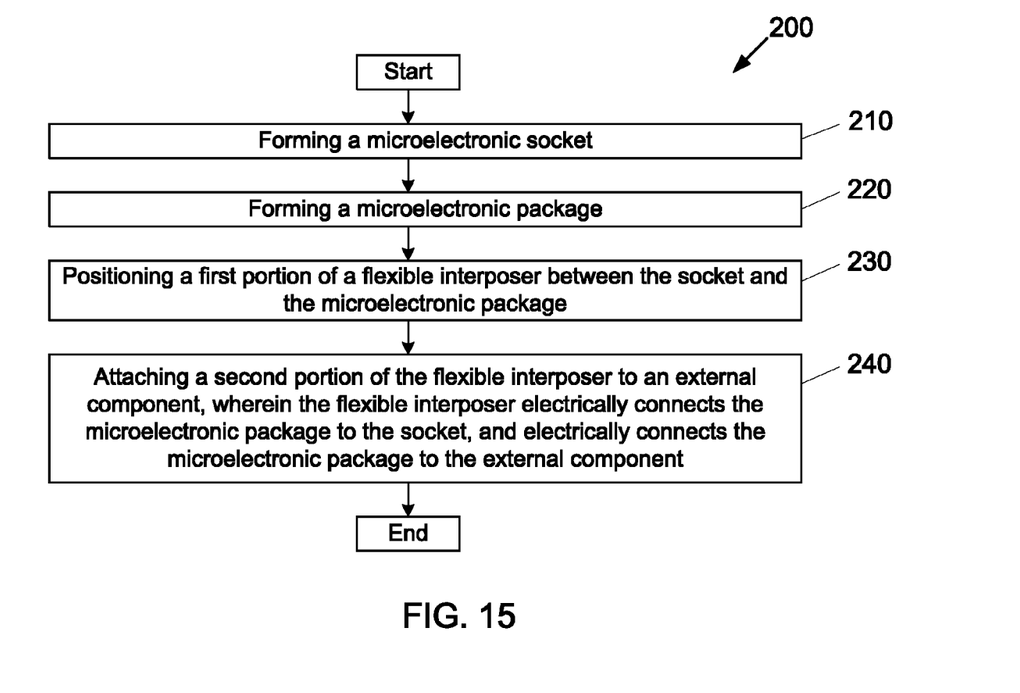
FIG. 15 is a flow chart of a process of mounting a microelectronic package to a microelectronic socket with a flexible interposer disposed between the microelectronic package and the microelectronic socket, according to an embodiment of the present description.

FIG. 15 is a flow chart of a process 200 of fabricating a microelectronic structure according to the various embodiments of the present description. As set forth in blocks 210 and 220 respectively, a microelectronic socket and a microelectronic package may be formed. A first portion of a flexible interposer may be positioned between the microelectronic socket and the microelectronic package, as set forth in block 230. As set forth in block 240, a second portion of the flexible interposer may be attached to an external component, where the flexible interposer electrically connects the microelectronic package to the microelectronic socket, and electrically connects the microelectronic to the external component.

Figure 16:
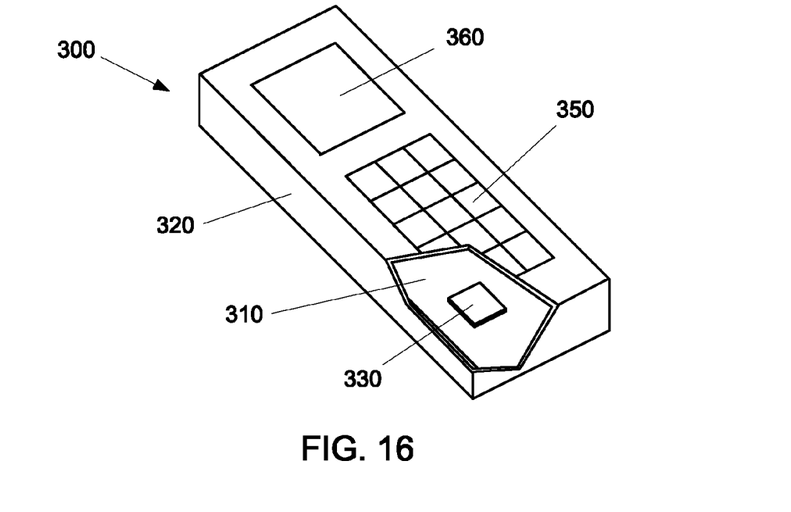
FIG. 16 illustrates a computer system, according to one embodiment of the present description.

FIG. 16 illustrates an embodiment of an electronic system/device 300, such as a portable computer, a desktop computer, a mobile telephone, a digital camera, a digital music player, a web tablet/pad device, a personal digital assistant, a pager, an instant messaging device, or other devices. The electronic system/device 300 may be adapted to transmit and/or receive information wirelessly, such as through a wireless local area network (WLAN) system, a wireless personal area network (WPAN) system, and/or a cellular network. The electronic system/device 300 may include a microelectronic motherboard or substrate 310 disposed within a device housing 320. The microelectronic motherboard/substrate 310 may have various electronic component electrically coupled thereto including a microelectronic package, a microelectronic socket, and a flexible interposer of the present description. The microelectronic package, the microelectronic socket, and the flexible interposer are shown generically as element 330 (details of these components have been shown and described with regard to FIGS. 1-14). The microelectronic motherboard 310 may be attached to various peripheral devices including an input device 350, such as keypad, and a display device 360, such an LCD display. It is understood that the display device 360 may also function as the input device, if the display device 360 is touch sensitive.

It is understood that the subject matter of the present description is not necessarily limited to specific applications illustrated in FIGS. 1-16. The subject matter may be applied to other microelectronic device applications, such a computer server racks, as will be understood to those skilled in the art.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A microelectronic structure, comprising:
   a flexible interposer having a first surface and a second surface, wherein the flexible interposer comprises:
      a plurality of flexible dielectric layers;
      a plurality of interconnects proximate the flexible interposer first surface;
      a plurality of contacts disposed proximate the flexible interposer second surface;
      at least one signal routing trace disposed between two flexible dielectric layer of the plurality of flexible dielectric layers;
      at least one first conductive via extending between at least one of the plurality of interconnects and the at least one signal routing trace; and
      at least one second conductive via extending between at least one of the plurality of interconnects and at least one of the plurality of contacts;
   a microelectronic socket;
   a microelectronic package, wherein a first portion of the flexible interposer is disposed between the microelectronic socket and the microelectronic package, wherein the flexible interposer electrically connects the microelectronic package to the microelectronic socket through the at least one second conductive via; and
   an external component, wherein a second portion of the flexible interposer is attached to the external components and electrically connects the microelectronic package to the external component.

2. The microelectronic structure of claim 1, further comprising a microelectronic substrate, wherein the microelectronic socket is electrically connected to the microelectronic substrate.

3. The microelectronic structure of claim 2, wherein the external component comprises the microelectronic substrate.

4. The microelectronic structure of claim 3, further comprising the flexible interposer second portion attached to the microelectronic substrate through a plurality substrate interconnects extending between the flexible interposer and the microelectronic substrate.

5. The microelectronic structure of claim 4, wherein the plurality substrate interconnects comprise a plurality of solder substrate interconnects.

6. The microelectronic structure of claim 2, further including a connection structure attached to the microelectronic substrate wherein the flexible interposer second portion is electrically connected to the connection structure.

7. The microelectronic structure of claim 1, further including a second flexible interposer attached to the external component, wherein the flexible interposer is connected to the second flexible interposer.

8. The microelectronic structure of claim 1, wherein the at least one interconnect comprises at least one micro-spring.

9. The microelectronic structure of claim 1, wherein the at least one interconnect comprises a conductive material selected from the group comprising copper, silver, gold and aluminum.

10. The microelectronic structure of claim 1, wherein the at least one interconnect comprises a deformable conductive material.

11. The microelectronic structure of claim 10, wherein the at least one interconnect comprises a polymer filled with a conductive material.

12. The microelectronic structure of claim 10, wherein the at least one interconnect comprises an adhesive filled with a conductive material.

13. A microelectronic structure, comprising:
   a flexible interposer having a first surface and a second surface, wherein the flexible interposer comprises:
      a plurality of flexible dielectric layers;
      a plurality of interconnects proximate the flexible interposer first surface;
      a plurality of contacts disposed proximate the flexible interposer second surface;
      at least one signal routing trace disposed between two flexible dielectric layer of the plurality of flexible dielectric layers;
      at least one first conductive via extending between at least one of the plurality of interconnects and the at least one signal routing trace; and
      at least one second conductive via extending between at least one of the plurality of interconnects and at least one of the plurality of contacts;
   a microelectronic socket; and
   a microelectronic package, wherein a first portion of the flexible interposer is disposed between the microelectronic socket and the microelectronic package, wherein the flexible interposer electrically connects the microelectronic package to the microelectronic socket through the at least one second conductive via, wherein the microelectronic package contacts at least one of the plurality of interconnects proximate the flexible interposer first surface, wherein the microelectronic socket contacts at least one of the plurality of contacts disposed proximate the flexible interposer second surface with at least one conductive structure extending through the microelectronic socket, and wherein the microelectronic socket is attached to a microelectronic substrate with at least one socket-to-substrate interconnect extending between the microelectronic substrate and at least one conductive structure of the microelectronic socket.

14. The microelectronic structure of claim 13, further comprising an external component, wherein a second portion of the flexible interposer is attached to the external components and electrically connects the microelectronic package to the external component.

15. The microelectronic structure of claim 14, wherein the external component comprises the microelectronic substrate.

16. The microelectronic structure of claim 15, further comprising the flexible interposer second portion attached to the microelectronic substrate through a plurality substrate interconnects extending between the flexible interposer and the microelectronic substrate.

17. The microelectronic structure of claim 16, wherein the plurality substrate interconnects comprise a plurality of solder substrate interconnects.

18. The microelectronic structure of claim 13, further including a connection structure attached to the microelectronic substrate wherein the flexible interposer second portion is electrically connected to the connection structure.

19. The microelectronic structure of claim 13, further including a second flexible interposer attached to the external component, wherein the flexible interposer is connected to the second flexible interposer.

20. The microelectronic structure of claim 13, wherein the at least one interconnect comprises at least one micro-spring.

21. The microelectronic structure of claim 13, wherein the at least one interconnect comprises a conductive material selected from the group comprising copper, silver, gold and aluminum.

22. The microelectronic structure of claim 13, wherein the at least one interconnect comprises a deformable conductive material.

23. The microelectronic structure of claim 22, wherein the at least one interconnect comprises a polymer filled with a conductive material.

24. The microelectronic structure of claim 22, wherein the at least one interconnect comprises an adhesive filled with a conductive material.

25. The microelectronic structure of claim 13, wherein the at least one conductive structure of the microelectronic socket includes a flexible projection contacting at least one of a plurality of contacts disposed proximate the flexible interposer second surface.

26. The microelectronic structure of claim 13, wherein the at least one socket-to-substrate interconnect comprises solder interconnects.

* * * * *